(12) United States Patent
Ha

(10) Patent No.: US 8,470,187 B2
(45) Date of Patent: Jun. 25, 2013

(54) METHOD OF DEPOSITING FILM WITH TAILORED COMFORMALITY

(75) Inventor: Jeongseok Ha, Tama (JP)

(73) Assignee: ASM Japan K.K., Tokyo (JP)

(*) Notice: Subject to any disclaimer, the term of this patent is extended or adjusted under 35 U.S.C. 154(b) by 293 days.

(21) Appl. No.: 12/940,906

(22) Filed: Nov. 5, 2010

(65) Prior Publication Data

US 2012/0111831 A1 May 10, 2012

(51) Int. Cl.
*B44C 1/22* (2006.01)

(52) U.S. Cl.
USPC .......... 216/37; 216/67; 438/758; 438/770; 438/773; 438/778; 438/787; 257/E21.576

(58) Field of Classification Search
USPC .......... 216/37, 67; 438/758, 770, 773, 778, 438/787; 257/E21.576
See application file for complete search history.

(56) References Cited

U.S. PATENT DOCUMENTS

| | | | |
|---|---|---|---|
| 6,303,523 B2 * | 10/2001 | Cheung et al. | 438/780 |
| 7,541,297 B2 * | 6/2009 | Mallick et al. | 438/778 |
| 2004/0029052 A1 * | 2/2004 | Park et al. | 430/314 |
| 2011/0210468 A1 * | 9/2011 | Shannon et al. | 264/139 |

OTHER PUBLICATIONS

Steven George, Chem.Rev. vol. 110, (2010), pp. 111-131.*

* cited by examiner

*Primary Examiner* — Lan Vinh
*Assistant Examiner* — Maki Angadi
(74) *Attorney, Agent, or Firm* — Snell & Wilmer L.L.P.

(57) ABSTRACT

A method of depositing a film with a target conformality on a patterned substrate, includes: depositing a first film on a convex pattern and a bottom surface; and depositing a second film on the first film, thereby forming an integrated film having a target conformality, wherein one of the first and second films is a conformal film which is non-flowable when being deposited and has a conformality of about 80% to about 100%, and the other of the first and second films is a flowable film which is flowable when being deposited.

16 Claims, 5 Drawing Sheets

METHOD OF DEPOSITING FILM WITH TAILORED COMFORMALITY

BACKGROUND

1. Field of the Invention

The present invention generally relates to a technology of depositing a film having a film thickness different at the top and bottom of a patterned surface of a substrate.

2. Description of the Related Art

Spacer defined double patterning (SDDP) technique has been developed for photolithography to enhance the feature density. The resolution of a photoresist pattern begins to blur at around 45 nm half-pitch. Thus, for the semiconductor industry, double patterning appears to be the only lithography technique to be used for nodes smaller than the 45 nm half-pitch nodes.

Conventionally, SDDP was performed as illustrated in FIG. 3. First, pre-patterned features 31 (e.g., photoresist) are formed on a hard mask 32 as shown in FIG. 3(a). Next, a conformal spacer film 33 is deposited to cover the pre-patterned features 31 and the hard mask 32 as shown in FIG. 3(b). A spacer will be a film layer formed on a sidewall of the pre-patterned feature 31. In order to form a spacer, anisotropic spacer etching is conducted as shown in FIG. 3(c) to remove all the film material on the bottom surface and the top surface, i.e., all the horizontal surfaces, leaving only the material on the non-horizontal surfaces including the sidewalls (33a and 33b). By removing the original pre-patterned features 31, only the spacer is left on the hard mask 32 as shown in FIG. 3(d). However, since the top portion of each pre-patterned feature is not flat, but at least partially rounded as shown in FIG. 3(a), not only the material on the sidewall but also the material 33a on a tapered or rounded portion (non-horizontal portion) of the pre-patterned feature is left when the anisotropic spacer etching is complete, forming an overhang portion 33c (inwardly declining portion) when the removal of the original pre-patterned feature is complete as shown in FIG. 3(d).

The above problem can be illustrated in FIGS. 6A and 6B. If a photoresist (PR) pre-patterned feature 63 formed on a substrate 62 has ideally a flat top, a conformal spacer film 61 covers the pre-patterned features and the bottom surface evenly as shown in the top figure of FIG. 6A. By using anisotropic spacer etching to remove the material on the horizontal surfaces (the middle figure of FIG. 6A), and by removing the original pre-patterned PR, a vertical spacer can be formed as shown in the bottom of FIG. 6A. However, forming the pre-patterned feature having a flat top is extremely difficult and in reality, all pre-pattered features have at least a partially rounded top. The shape of the pre-patterned feature illustrated in FIG. 3 is simplified for easier understanding and the actual shape of the pre-patterned feature is likely to be like the one illustrated in FIG. 6B. If a photoresist (PR) pre-pattered feature 67 formed on a substrate 66 has a rounded top, a conformal spacer film 65 covers the pre-patterned features and the bottom surface evenly as shown in the top figure of FIG. 6B. By using anisotropic spacer etching to remove the material on the horizontal surfaces (the middle figure of FIG. 6B), followed by removing the original pre-patterned PR, not only a vertical portion formed on the sidewall but also a curved portion formed on the rounded top is left as shown in the bottom figure of FIG. 6B. In the above, if the etching continues until the overhang portion is removed, the substrate is over-etched and the surface layer such as a hard mask is undercut. As a result, unavoidably the overhang portion of the spacer is formed, and due to the overhang portion, the distance 69 between the top edges of the spacer becomes smaller than that between inner vertical portions of the spacer.

Returning to FIG. 3(d), using the spacer 33a, 33b, anisotropic etching is performed for pattern transfer as shown in FIG. 3(e), wherein a pattern transfer layer 34 is formed on a substrate 35. Because of the overhang portion 33c of the spacer, the distance D1 between the top edges of the spacer is smaller than the distance between the vertical portions of the spacer (D1+2D2), and the pattern transfer layer 34 is not accurately etched in the vertical direction. That is, at an upper portion of the hard mask and the pattern transfer layer, unexpected critical dimension (CD) changes occur, and at the bottom, CD increases by D2 by the overhang residual portion as shown in FIG. 3(f).

To solve the above problem, the use of an additional hardmask layer having high etch selectivity (e.g., amorphous CVD carbon or spin-on carbon) may be adopted. However, that requires more processing steps and processing complexity, thereby increasing production cost.

SUMMARY

An embodiment of the present invention provides a method of depositing a film with film thickness different at top and bottom, by combining conformal film deposition and flowable film deposition. By this method, a spacer film can have a first thickness at the bottom so as to enable extensive etching at the bottom until a residual spacer formed at the top is removed while inhibiting undercutting a layer at the bottom, and have a second thickness at the top so as to adjust the timing of removal of the residual spacer at the top to be matched with the timing of removal of the bottom portion of the spacer. This method solves the residual spacer problem without any additional hardmask layer. This technology can be applied not only to SDDP but also any other suitable applications (e.g., sacrificial layer to prevent damage on underlying layer), which require a film having a tailored conformality. A combination of conformal film deposition and flowable film deposition makes it possible to perform fine and precise control over the thickness of a film depositing on a side wall in combination with thickness control of a film depositing on top and bottom surfaces. Further, by using both conformal film deposition and flowable film deposition, the thicknesses of films depositing on a plurality of side walls can be controlled to be substantially the same ("substantially" refers to a difference of 1% or less, 5% or less, or 10% or less). Uniform thickness of films depositing on side walls is highly advantageous for their use as spacers. If flowable film deposition is used alone, the thickness of films varies among top, bottom, and side surfaces, and also among individual convex structures, highly depending on the structures and shapes of the surfaces.

In some embodiments, a combination of the two depositions can be accomplished continuously in-situ in the same reactor. In some embodiments, the conformal film and the flowable film can be formed using the same precursor.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DETAILED DESCRIPTION

The disclosed embodiments includes a method of depositing a film with a target conformality on a patterned substrate, comprising: (i) providing a substrate having a convex pattern and a bottom surface, said convex pattern having an at least partially rounded top; (ii) depositing a first film on the convex pattern and the bottom surface; and (iii) depositing a second film on the first film, thereby forming a film having a target conformality constituted by the first and second films integrated on the substrate, wherein one of the first and second films is a conformal film which is non-flowable when being deposited and has a conformality of about 80% to about 100%, and the other of the first and second films is a flowable film which is flowable when being deposited, wherein the target conformality of the film constituted by the first and second films integrated is achieved by changing a duration of the step of depositing the first film and a duration of the step of depositing the second film.

Figure 5A:
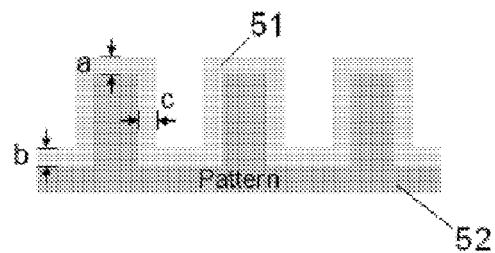
FIG. 5A is a schematic cross sectional view of a conformal film deposited on pre-patterned features.

In this disclosure, "conformality" can be defined as the ratio percent of the thinnest thickness of a layer deposited on a patterned surface to the thickest thickness of the layer. For example, in FIG. 5A, the conformality is a ratio percent of Min (a, b, c)/Max (a, b, c) wherein a conformal film 51 is deposited on a patterned substrate 52, and a is the thickness on the top, b is the thickness at the bottom, and c is the thickness on the sidewall. In some embodiments, the conformality may also be defined simply as the ratio percent of the average thickness of a layer deposited on a top surface to the average thickness of a layer deposited at a bottom of a trench, since the difference between the thickness on the top and that on the sidewall is typically insubstantial as compared with the difference between the thickness on the top and that on the bottom. In some embodiments, the "conformal film" refers to a film having a conformality of about 80% or higher, about 90% or higher, or about 95% or higher, or about 100% or less (or in any ranges defined by the foregoing).

Figure 5B:
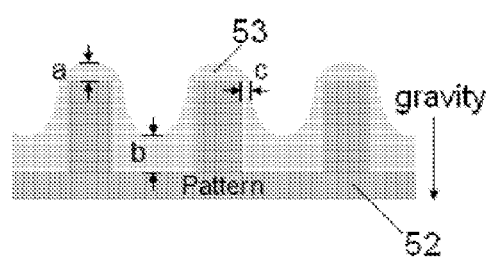
FIG. 5B is a schematic cross sectional view of a flowable film deposited on pre-patterned features.
Figure 6A:
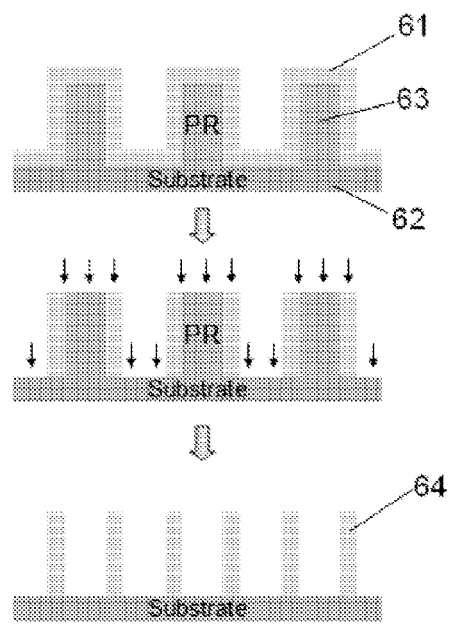
FIG. 6A schematically illustrates processes for forming spacers using flat top pre-patterned features.
Figure 6B:
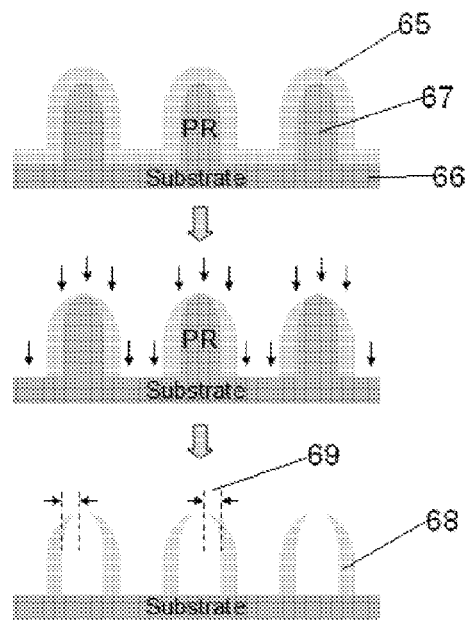
FIG. 6B schematically illustrates processes for forming spacers using rounded top pre-patterned features.

In this disclosure, the "flowable film" refers to a film which is formed of a liquid-like material and is flowable on a surface when being deposited thereon so as to change its shape by gravity and/or surface tension according to the surface structure. The flowable film is movable upon being deposited on a surface from one place where potential energy is high to another place where potential energy is low relative to each other. For example, in FIG. 5B, a flowable film 53 covers a patterned substrate 52 and behaves as viscous liquid, wherein a portion at a bottom where potential energy is low is thicker (thickness b) than a portion at a top (thickness a) or on a sidewall (thickness c) where potential energy is high due to gravity and surface tension. In some embodiments, the flowable film has a ratio of thickness at a bottom surface to thickness on a top surface, which is more than 100%, about 105% or higher, about 110% or higher, about 120% or higher, about 130% or higher, or about 150% or higher, or about 200% or higher (or in any ranges defined by the foregoing). The terms "flowable" and "non-flowable" can be defined based on the above characteristics. Further, "flowable" refers to the initial state upon being deposited, and the "flowable film" also refers to a film which was flowable upon being deposited on a surface but is non-flowable after deposition with post-deposition treatment such as plasma treatment and/or thermal treatment to fix or solidify the flowable state.

In this disclosure, "gas" may include vaporized solid and/or liquid and may be constituted by a single gas or a mixture of gases, and "film" may be constituted by a single uniform layer, multiple non-discrete layers integrated in a thickness direction, or multiple discrete layers integrated in a thickness direction each layer having a different composition or substantially the same composition. Further, in this disclosure, any ranges indicated may include or exclude the endpoints.

In some embodiments, the patterned surface of the substrate has an aspect ratio of at least about 1 or in any ranges defined by the foregoing. In some embodiments, the width of the recess may be in a range of about 40 nm to about 500 nm, typically about 50 nm to about 180 nm.

Figure 1:
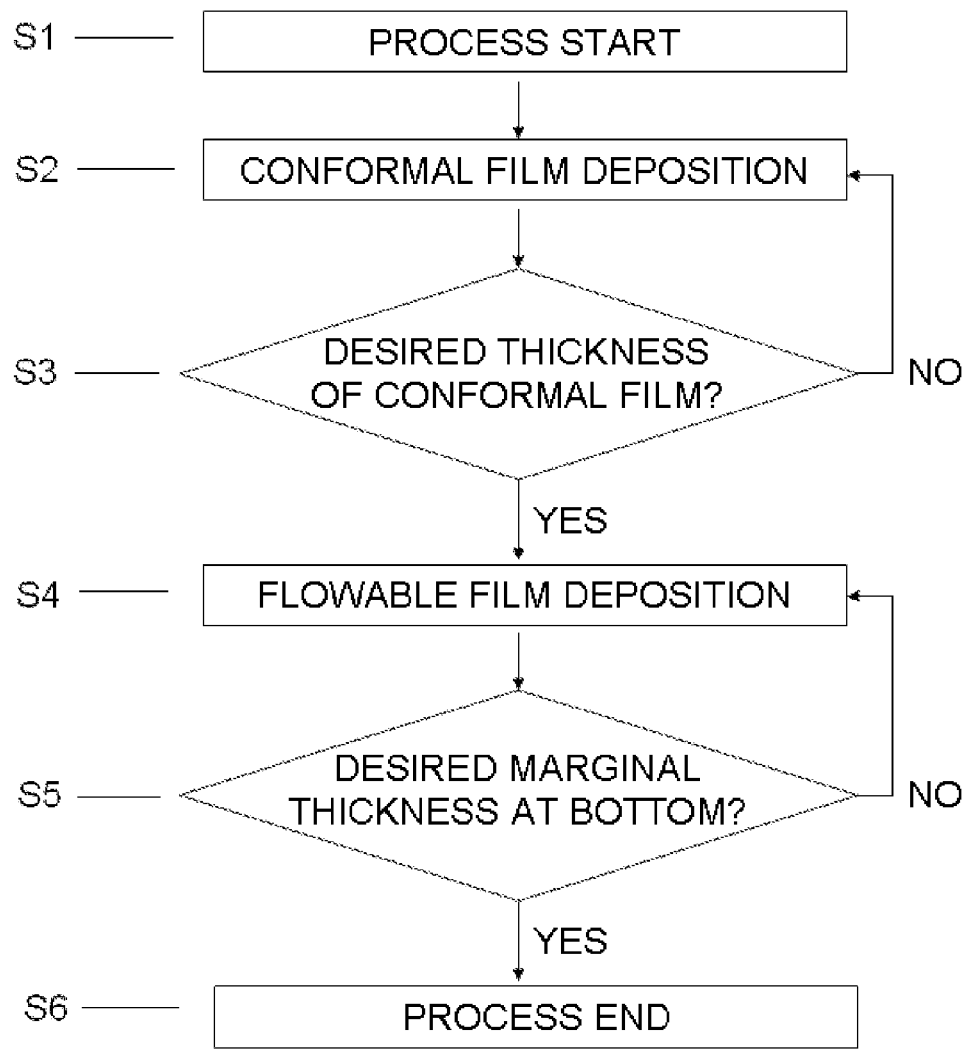
FIG. 1 is a flow chart of deposition processes according to an embodiment of the present invention.

In some embodiments, the first film is the conformal film, and the second film is the flowable film. Alternatively, the first film can be the flowable film and the second film can be the conformal film. FIG. 1 shows a flow chart of deposition processes according to an embodiment wherein one set of a conformal film and a flowable film is formed. In FIG. 1, after the patterned surface is obtained, the process starts (S1). In this embodiment, conformal film deposition is performed first (S2). In atomic layer deposition (ALD), the thickness of film is adjusted by controlling the number of deposition cycles, e.g., repeating pulses of precursor. When the desired thickness of the conformal film is obtained (S3), flowable film deposition begins (S4). The conformal film deposition continues until the desired thickness is obtained. The flowable film deposition continues until the desired marginal thickness is obtained at the bottom (S5). In pulsed plasma enhanced chemical vapor deposition (pulsed PECVD), the thickness of film is adjusted by controlling the number of deposition cycles, e.g., repeating pulses of RF power. When the desired marginal thickness is obtained, the process ends (S6). In some embodiments, post-deposition treatment is performed on the flowable film, such as plasma treatment and/or thermal treatment. In some embodiments, the flowable film consists of multiple flowable layers stacked in a thickness direction each being a discrete layer wherein each flowable layer is subjected to post-deposition treatment so as to fix or solidify the layer before stacking. This way the ratio percent of thickness on the bottom and thickness on the top can be widely controlled. In some embodiments, when a conformal film is deposited on a flowable film, the flowable film is treated by post-deposition treatment before the conformal film is deposited thereon.

In some embodiments, the conformal film is deposited by plasma enhanced atomic layer deposition (PEALD). Alternatively, the conformal film can be deposited by pulsed plasma enhanced chemical vapor deposition (pulsed PECVD) or any other suitable methods.

In some embodiments, the flowable film is deposited by plasma enhanced chemical vapor deposition (PECVD). Typically, the flowable film can be deposited by pulsed PECVD. The pulsed PECVD includes PECVD wherein RF power is applied in pulses, and/or a precursor is introduced in pulses. Non-pulsed PECVD is also usable wherein RF power is applied continuously and a precursor is introduced continuously. The flowable film can be deposited by any other suitable methods.

In some embodiments, the first and second films are deposited using the same silicon precursor. Using the same precursor is advantageous in view of productivity and uniformity of the resultant integrated film. However, the first and second films can be deposited using different silicon precursors.

In some embodiments, the silicon precursor has a formula of $Si_\alpha H_\beta X_\gamma$, wherein $\alpha$, $\beta$ and $\gamma$ are integers ($\gamma$ includes zero), wherein X comprises N and/or Cl. In an embodiment, $\alpha$ may be 1 to 5, $\beta$ may be 1 to 10, and $\gamma$ may be 0 to 6. In some embodiments, the silicon precursor is selected from the group consisting of $N(SiH_3)_3$, $SiH_4$, $Si[N(C_2H_5)_2]_2H_2$, $Si[N(CH_3)_2]_3H$, $[(CH_3)_2N]_3SiCl$, $Si[N(CH_3)(C_2H_5)]_3H$, $Si_2[NH(C_2H_5)_6]$, and $SiH_2[N(C_2H_5)_2]$. In some embodiments, the silicon precursor has a formula of $Si_\alpha H_\beta(OR)_\gamma$, wherein $\alpha$, $\beta$ and $\gamma$ are integers ($\beta$ includes zero), wherein R comprises $C_xH_y$, where x may be 1 to 6, and y may be 3 to 13.

In some embodiments, the first and second films are deposited in the same reaction chamber. Alternatively, in some embodiments, the first and second films are deposited in different reaction chambers.

In some embodiments, the convex pattern of the substrate is constituted by a photoresist pattern, and the integrated film is used as a spacer. The convex pattern can be formed by any suitable methods including any conventional methods. In some embodiments, the photoresist can be made of photoacid generator and polymer body and formed by conventional photolithography.

In some embodiments, the method further comprises depositing a third film or more films on the second film to alternately deposit the conformal film and the flowable film in a thickness or gravity direction. In some embodiments, one set of conformal deposition and flowable deposition is sufficient, and in some other embodiments, the set can be repeated once or more (e.g., 1 to 5) until the desired thickness is obtained. For example, the resultant integrated film has a bi-layer structure constituted by a flowable film and a conformal film, a tri-layer structure constituted by a flowable film sandwiched by conformal films, or a laminated structure constituted by more than one set of a conformal film and a flowable film.

In some embodiments, the method further comprises anisotropically etching the integrated film in a thickness direction to remove substantially all portions of the integrated film on the top including the rounded area of the convex pattern and on the bottom surface in the thickness direction, leaving a side portion of the integrated film on a side of the convex pattern, said side portion extending in the thickness direction.

In some embodiments, the conformal and/or flowable film is a SiO, SiC, or SiN film.

In some embodiments, the conformal film may be deposited by PEALD under the following conditions:

Susceptor temperature: −20 to 400° C., preferably 20 to 400° C.

Precursor flow rate: 1 to 20 sccm, preferably 2 to 8 sccm

Precursor pulse duration: 0.1 to 60 sec, preferably 0.2 to 30 sec

Intervals between the pulses: 0.2 to 600 sec, preferably 0.4 to 60 sec

Number of cycles: 1 to 1000 cycles, preferably 10 to 500 cycles (cycle number depends on target thickness)

Carrier gas flow rate: 100 to 3000 sccm, preferably 300 to 2000 sccm

Additive gas flow rate: 10 to 2000 sccm, preferably 100 to 1000 sccm

Deposition pressure: 50 to 1000 Pa, preferably 100 to 600 Pa

Plasma power (13.56 MHz): 10 to 1000 W, preferably 30 to 800 W

Thickness at the top: 1 to 50 nm, preferably 10 to 30 nm

Conformity: 80% to 100%, preferably 90% to 100%

In some embodiments, the carrier gas may be one or more gases selected from the group consisting of He, Ar, Kr, and Xe. In some embodiments, the additive gas may be one or more gases selected from the group consisting of an oxygen supplying gas (e.g., $O_2$, $N_2O$, $H_2O_2$, $O_3$), hydrocarbon gas (e.g., hexane, pentane, ethanol), nitrogen supplying gas (e.g., $N_2$, $NH_3$, $N(CH_3)_3$), hydrogen gas, which is/are selected depending on the type of film.

In some embodiments, the RF power has a frequency such as 13.56 MHz, 27 MHz, or 60 MHz. In some embodiments, a combination of RF power having different frequencies (e.g., a combination of less than 2 MHz and higher than 5 MHz) can be used.

In some embodiments, the carrier gas and the additive gas are introduced continuously, and RF power is continuously applied.

The conformal film can be deposited by any other suitable methods and conditions.

In some embodiments, the flowable film can be deposited by pulsed PECVD under the following conditions:

Susceptor temperature: −20 to 100° C., preferably 0 to 70° C.

Precursor flow rate: 1 to 50 sccm, preferably 2 to 10 sccm

Precursor pulse duration: 0.3 to 30 sec, preferably 1 to 5 sec

Intervals between the pulses: 0.3 to 60 sec, preferably 0.5 to 10 sec

Number of cycles: 50 to 500 cycles, preferably 100 to 300 cycles

Carrier gas flow rate: 100 to 3000 sccm, preferably 200 to 500 sccm

Additive gas flow rate: 0 to 1000 sccm, preferably 0 to 500 sccm

Deposition pressure: 50 to 1000 Pa, preferably 200 to 600 Pa

Plasma power (13.56 MHz): 10 to 1000 W, preferably 50 to 400 W

Thickness at the bottom: 1 to 200 nm, preferably 5 to 50 nm

Ratio of bottom thickness/top thickness: 105% or higher, preferably less than 500%

The other conditions can be the same as those for the conformal film deposition. The flowable film can be deposited by any other suitable methods and conditions. In some embodiments, for the flowable film deposition, because a film depositing on a surface is flowable, the susceptor temperature and/or RF power is/are low enough for maintaining the flowable state on the surface. Thus, when the same gases are used for the conformal film deposition and the flowable film deposition, at least one of the susceptor temperature or RF power is lower in the flowable film deposition than that in the conformal film deposition. For example, if in-situ deposition of both conformal film and flowable film is conducted in the same reactor, using different temperatures for conformal film deposition and flowable film deposition may not be easy, and thus, using different RF power is effectively adapted. If separate deposition of conformal film and flowable film is conducted in separate reactors, using different temperatures for conformal film deposition and flowable film deposition can effectively be adapted. Further, the flowable characters of a flowable film can be adjusted by controlling other process parameters such as oxygen gas flow rate and deposition pressure. For example, the oxygen flow rate is reduced for the flowable film deposition, and if the same reactor is used for both flowable and conformal films, the oxygen flow rate may be zero for the flowable film deposition.

In some embodiments, the flowable film is subjected to post-deposition treatment such as plasma treatment, thermal treatment, and/or UV treatment so as to fix or solidify the film, thereby enabling depositing another film thereon. The another film can be another flowable film or a conformal film. The post-deposition treatment can be conducted under the following conditions:

Plasma Treatment

Plasma power (13.56 MHz): 50 to 1000 W, preferably 100 to 400 W

Susceptor temperature: −20 to 400° C., preferably 30 to 200° C.

Pressure: 50 to 1000 Pa, preferably 100 to 600 Pa

Duration: 5 to 600 sec, preferably 10 to 120 sec

Plasma gas flow rate: 100 to 2000 sccm, preferably 500 to 1000 sccm

Inert gas flow rate: 500 to 3000 sccm, preferably 500 to 2000 sccm

Thermal Treatment

Temperature: −20 to 400° C., preferably 30 to 200° C.

Duration: 5 to 600 sec, preferably 10 to 120 sec

Inert gas flow rate: 500 to 3000 sccm, preferably 500 to 2000 sccm

UV Treatment

UV wavelength: 185 to 800 nm, preferably 250 to 450 nm

UV power: 100 to 1000 W, preferably 300 to 800 W

Temperature: 30 to 400° C., preferably 100 to 200° C.

Duration: 5 to 600 sec, preferably 10 to 120 sec

Inert gas flow rate: 500 to 3000 sccm, preferably 500 to 2000 sccm

The plasma gas may be oxygen, hydrogen, nitrogen, or a mixture thereof. The inert gas may be He, Ar, Kr, and/or Xe. The plasma treatment can be accomplished in the same rector as for the flowable film deposition. The thermal treatment may be accomplished in a furnace. UV treatment may be accomplished in a UV irradiation chamber.

By combining a conformal film and a flowable film or a multiple-layer flowable film, an integrated film having a desired ratio of thickness at the bottom and thickness at the top can be formed. The desired ratio varies depending on the applications. In some embodiments, the ratio percent may be more than about 110%, more than about 120%, more than about 130%, or more than about 150%, and less than about 200%. In some embodiments, a ratio of thickness attributed to the conformal film to total thickness at the bottom is about 9/10 to about 1/10, typically about 8/10 to about 3/10.

Figure 4:
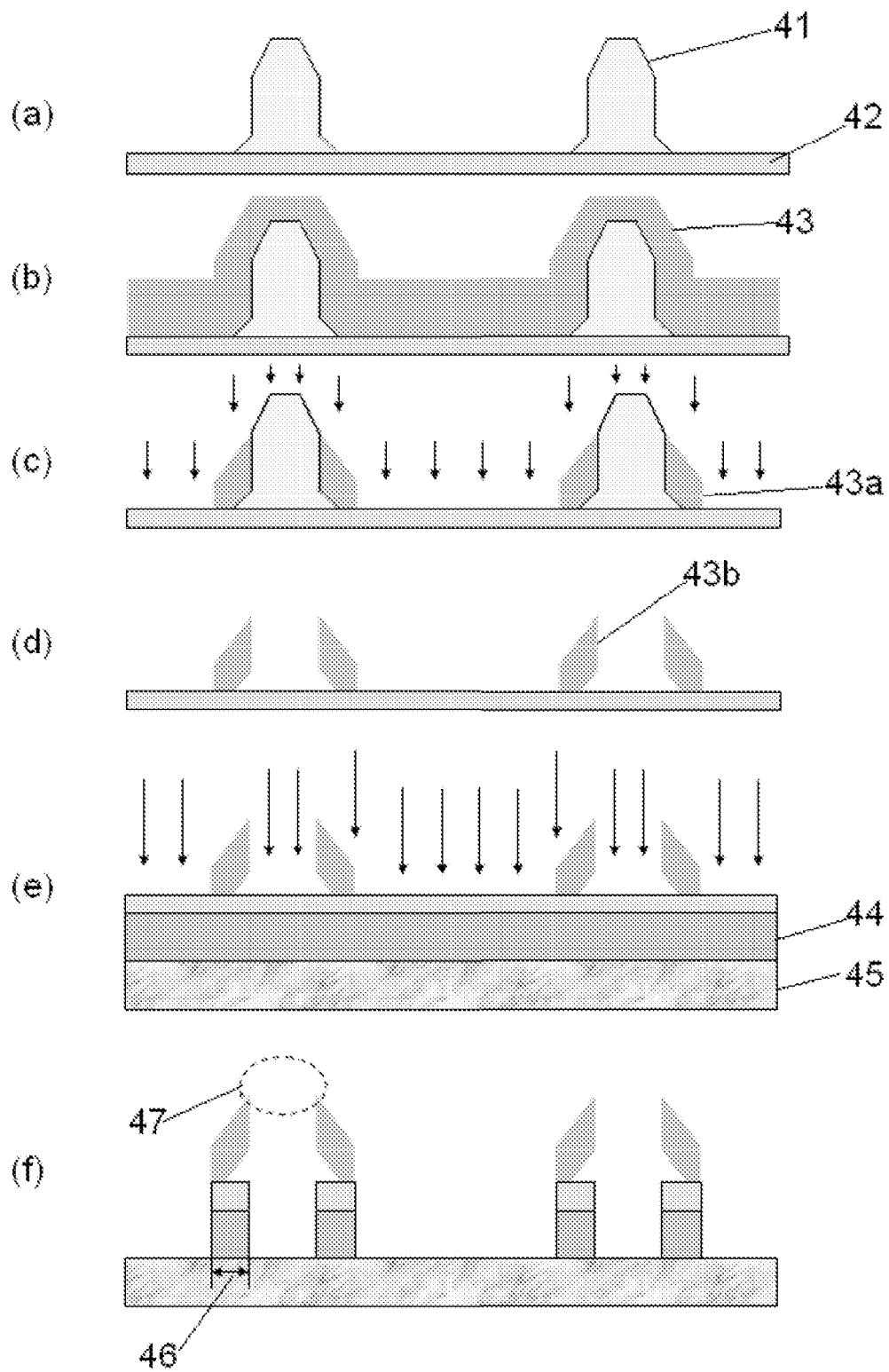
FIG. 4 schematically illustrates SDDP processes according to an embodiment of the present invention, wherein (a) is a schematic cross sectional view of pre-patterned features formed on a hard mask, (b) is a schematic cross sectional view of conformal spacer deposition, (c) is a schematic cross sectional view of anisotropic spacer etching, (d) is a schematic cross sectional view of removal of the pre-patterned features, (e) is a schematic cross sectional view of pattern transfer by anisotropic etching, and (f) is a schematic cross sectional view of transferred pattern profile.

This is advantageous for SDDP as shown in FIG. 4 which illustrates an embodiment of the present invention.

First, pre-patterned features 41 (e.g., photoresist) are formed on a hard mask 42 as shown in FIG. 4(a). Next, an integrated spacer film 43 which is a combination of a conformal film and a flowable film is deposited according to any of the disclosed embodiments to cover the pre-patterned features 41 and the hard mask 42 as shown in FIG. 4(b). The integrated film spacer has a desired ratio of thickness at the top to thickness at the bottom. A spacer will be a film layer formed on a sidewall of the pre-patterned feature 41. In order to form a spacer, anisotropic spacer etching is conducted as shown in FIG. 4(c) to remove all the film material on the bottom surface and the top surface including the slanted surfaces, i.e., all the horizontal surfaces and slanted surfaces at the top, leaving only the material on the sidewalls (43a). Because the thickness of the film at the slanted surfaces and the thickness of the film at the bottom surface are such that portions of the film at the slanted surface and at the bottom surface are removed by etching nearly at the same time, after removing the original pre-patterned features 41, complete removal of the residual portion at the top is realized, and only the spacer is left on the hard mask 42 as shown in FIG. 4(d). The inner wall 43b of the spacer does not have an overhang portion at the top edge. Using the spacer 43a, anisotropic etching is performed for pattern transfer as shown in FIG. 4(e), wherein a pattern transfer layer 44 is formed on a substrate 45. Because no overhang portion is formed, the distance between the top edges of the spacer and the distance between the vertical portions of the spacer are substantially or nearly the same (±20% or less, ±10% or less, or ±5% or less), and the pattern transfer layer 44 is accurately etched in the vertical direction. That is, complete removal of the residual portion at the top 47 is achieved, and critical dimension (CD) variation can be minimized as shown in FIG. 4(f).

In the present disclosure where conditions and/or structures are not specified, the skilled artisan in the art can readily provide such conditions and/or structures, in view of the present disclosure, as a matter of routine experimentation. Also, in the present disclosure, the numerical numbers applied in specific embodiments can be modified by a range of at least ±50% in other embodiments, and the ranges applied in embodiments may include or exclude the endpoints.

EXAMPLES

A flowable film was deposited using bis-diethylaminosilane (BDEAS) and no oxygen gas, and a conformal film was also deposited using bis-diethylaminosilane (BDEAS) and oxygen gas, in the same reactor under the conditions shown in Table 1.

TABLE 1

|  | Flowable film deposition | Conformal film deposition |
| --- | --- | --- |
| Process | Pulsed PECVD | PEALD |
| Susceptor temperature (° C.) | 20 | 20 |
| Source vessel temperature (° C.) | 25 | 25 |
| BDEAS flow rate (sccm) | 10 | 4 |
| Carrier Ar flow rate (sccm) | 400 | 400 |
| Deposition pressure (Pa) | 300 | 200 |
| Oxygen gas flow rate (sccm) | 0 | 200 |
| Plasma power (W) | 40 | 200 |

If separate reactors are used, the deposition conditions will be adjusted as shown in Table 2.

TABLE 2

|  | Flowable film deposition | Conformal film deposition |
| --- | --- | --- |
| Process | Pulsed PECVD | PEALD |
| Susceptor temperature (° C.) | −20 | 70 |
| Source vessel temperature (° C.) | 25 | 25 |
| BDEAS flow rate (sccm) | 10 | 4 |
| Carrier Ar flow rate (sccm) | 400 | 400 |
| Deposition pressure (Pa) | 300 | 200 |
| Oxygen gas flow rate (sccm) | 10 | 200 |
| Plasma power (W) | 40 | 40 |

First, a substrate having a pre-patterned photoresist (made of poly(methylmethacrylate); alternatively poly(methylglutarimide) or phenol formaldehyde resin can be used) was obtained. The photoresist pattern had a width of 60 nm, and a height of 120 nm, and a distance between adjacent patterns was 180 nm. Each pre-patterned photoresist had a rounded top.

Second, a conformal film was deposited on the substrate using the above conditions and the following additional conditions:

Pulse duration: 0.3 sec
Interval: 1.5 sec (a cycle duration of 1.8 sec)
Number of cycles: 80 cycles for 20 nm; 100 cycles for 25 nm; and 120 cycles for 30 nm (the thickness at the top, although the thickness at the bottom was expected to be the same).

Third, a flowable film was deposited on the conformal film using the above conditions and the following additional conditions:

Pulse duration: 1 sec
Interval: 1 Sec (a cycle duration of 2 sec)
Number of cycles: 50 cycles for one layer (A.U. 1), 100 cycles for two layers (A.U. 2), 150 cycles for three layers (A.U. 3), 200 cycles for four layers (A.U. 4), 250 cycles for five layers (A.U. 5)

Figure 2:
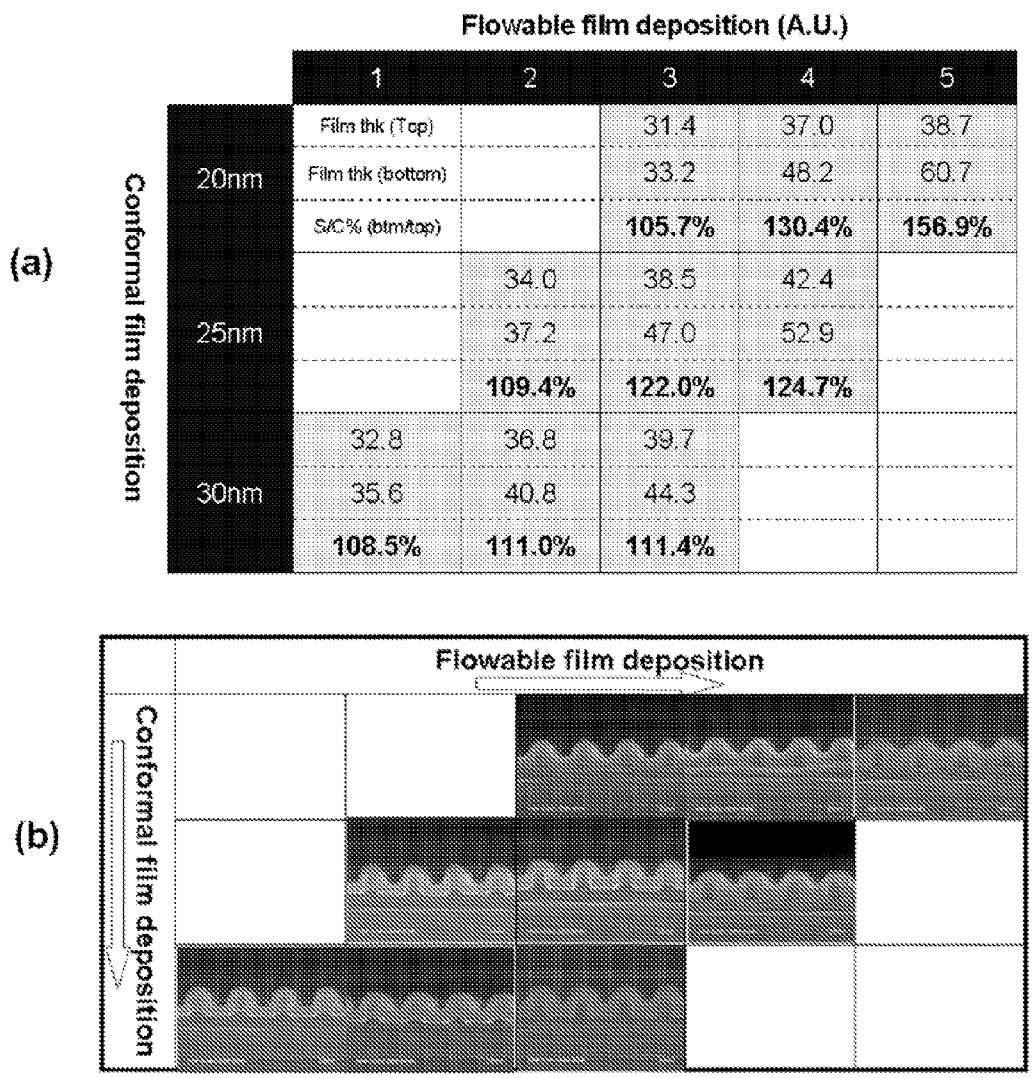
FIG. 2 shows results of a combination of conformal deposition and flowable deposition according to embodiments of the present invention, wherein (a) shows thickness of each resultant film at the top, the bottom, and their ratio (bottom/top), and (b) shows SEM photographs of cross-sectional views of the respective resultant films.
Figure 3:
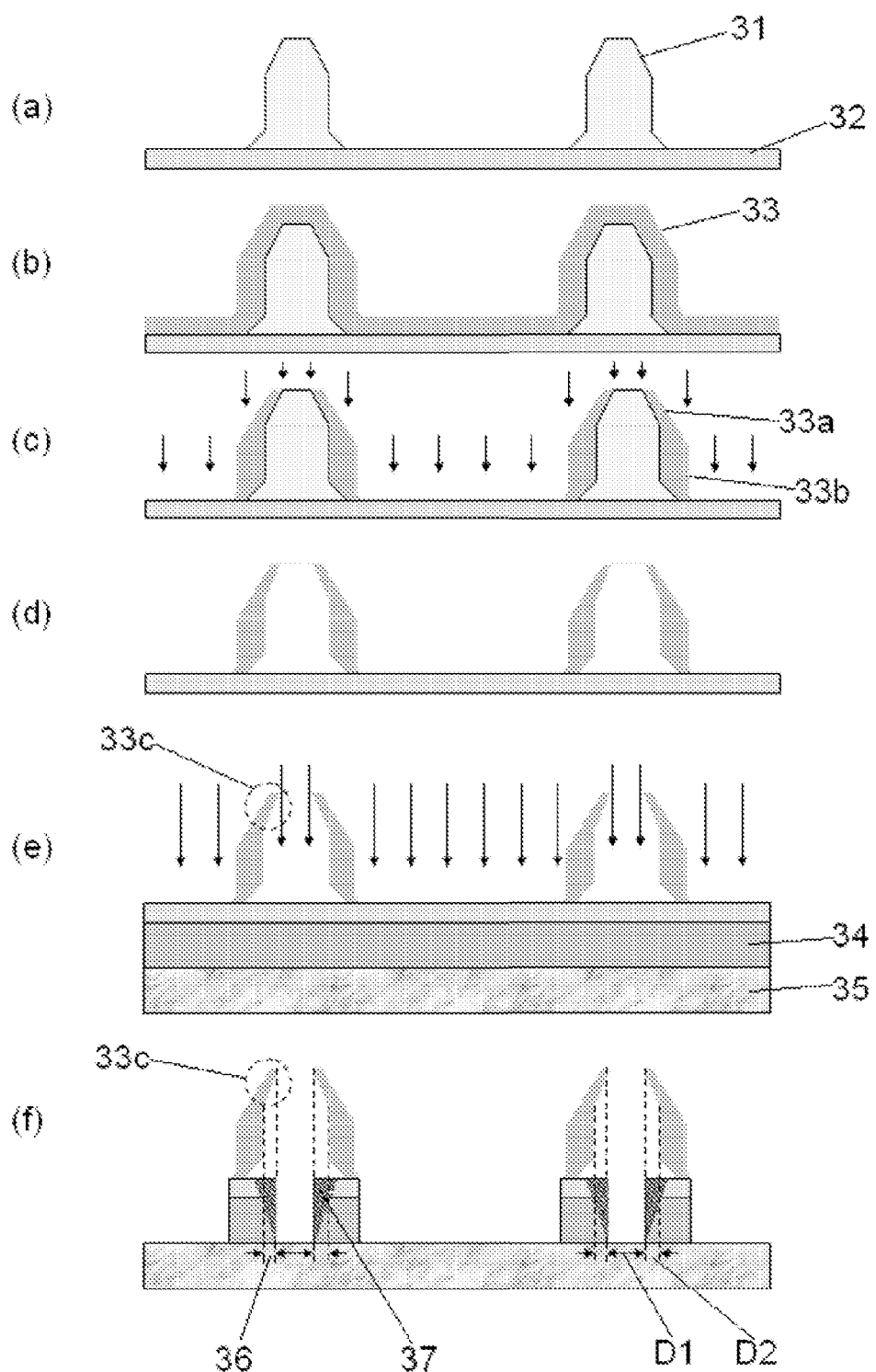
FIG. 3 schematically illustrates conventional SDDP processes, wherein (a) is a schematic cross sectional view of pre-patterned features formed on a hard mask, (b) is a schematic cross sectional view of conformal spacer deposition, (c) is a schematic cross sectional view of anisotropic spacer etching, (d) is a schematic cross sectional view of removal of the pre-patterned features, (e) is a schematic cross sectional view of pattern transfer by anisotropic etching, and (f) is a schematic cross sectional view of transferred pattern profile.

The results are shown in FIG. 2, wherein (a) shows thickness at the top, thickness at the bottom, and their ratio (bottom/top) of each film, and (b) shows SEM photographs of cross-sectional views of the respective films where the columns and rows of (a) and (b) are matched. As shown in FIG. 2, by combining a conformal film and a flowable film, an integrated film having various bottom/top ratios (108.5% to 156.8%) and various overall thicknesses (35.6 nm to 60.7 nm at the bottom) can be formed, so that it is possible to accommodate for various SDDP with minimum CD changes. When no flowable film was formed, a 30-nm conformal film had a thickness of 29.8 nm on the top, a thickness of 29.2 nm at the bottom, a thickness of 29.5 nm on the sidewall, a ratio of bottom/top of 98.2%, and a ratio of side/top of 99.4%. For example, if a difference between thickness at the bottom and thickness at the top needs to be 4 nm to 10 nm for certain SDDP, a combination of a 30-nm conformal film and a two-layer flowable film, a combination of a 30-nm conformal film and a three-layer flowable film, a combination of a 25-nm conformal film and a three-layer flowable film, a combination of a 25-nm conformal film and a four-layer flowable film, a combination of a 20-nm conformal film and a four-layer flowable film, and a combination of a 20-nm conformal film and a five-layer flowable film can suitably be used.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of depositing a film with a target non-conformality on a patterned substrate, comprising:
   providing a substrate having a convex pattern and a bottom surface, said convex pattern having a vertical portion with a top which is at least partially rounded;
   depositing a first film on the convex pattern and the bottom surface; and
   depositing a second film on the first film, thereby forming a film having a target non-conformality for forming a spacer therefrom, which film is constituted by the first and second films integrated on the substrate, wherein the convex pattern of the substrate is constituted by a photo resist pattern,
   wherein one of the first and second films is a conformal film which is non-flowable when being deposited and has a conformality of about 80% to about 100%, and the other of the first and second films is a flowable film which is flowable when being deposited,
   wherein the target non-conformality of the film constituted by the first and second films integrated is achieved by changing a duration of the step of depositing the first film and a duration of the step of depositing the second film.

2. The method according to claim 1, wherein the first film is the conformal film, and the second film is the flowable film.

3. The method according to claim 1, wherein the flowable film consists of multiple flowable layers, and the method further comprises conducting post-deposition treatment on each flowable layer to fix the layer.

4. The method according to claim 1, wherein the conformal film is deposited by plasma enhanced atomic layer deposition (PEALD).

5. The method according to claim 1, wherein the flowable film is deposited by plasma enhanced chemical vapor deposition (PECVD).

6. The method according to claim 5, wherein the PECVD is pulsed PECVD.

7. The method according to claim 1, wherein the first and second films are deposited using the same silicon precursor.

8. The method according to claim 1, wherein the first and second films are deposited in the same reaction chamber.

9. The method according to claim 1, wherein the first and second films are deposited in different reaction chambers.

10. The method according to claim 1, wherein the conformal film has a conformality of about 90% to 100%, and the flowable film has a ratio percent of thickness on the top of the convex pattern to thickness on the bottom surface, said ratio percent being about 105% or higher.

11. The method according to claim 1, further comprising depositing a third film or more films on the second film to alternately deposit the conformal film and the flowable film in a thickness or gravity direction.

12. The method according to claim 1, wherein the conformal film and the flowable film are deposited at a temperature of 150° C. or lower and using RF power with a power of less than 1000 W.

13. The method according to claim 1, further comprising conducting post-deposition treatment on the flowable film when another film is deposited on the flowable film.

14. The method according to claim 1, wherein the conformal film and the flowable film are SiO, SiC, or SiN films.

15. The method according to claim 1, wherein a ratio of a thickness attributed to the conformal film to the total thickness of the integrated film at the bottom is about 9/10 to about 1/10.

16. A method of depositing a film with a target conformality on a patterned substrate, comprising:
    providing a substrate having a convex pattern and a bottom surface, said convex pattern having a top which is at least partially rounded;
    depositing a first film on the convex pattern and the bottom surface; and
    depositing a second film on the first film, thereby forming a film having a target conformality constituted by the first and second films integrated on the substrate,
    wherein one of the first and second films is a conformal film which is non-flowable when being deposited and has a conformality of about 80% to about 100%, and the other of the first and second films is a flowable film which is flowable when being deposited,
    wherein the target conformality of the film constituted by the first and second films being integrated is achieved by changing a duration of the step of depositing the first film and a duration of the step of depositing the second film,
    said method further comprising anisotropically etching the integrated film in a thickness direction to remove substantially all portions of the integrated film on the top including the rounded area of the convex pattern and on the bottom surface in the thickness direction, leaving a side portion of the integrated film on a side of the convex pattern, said side portion extending in the thickness direction.

* * * * *